United States Patent
Grossman et al.

(10) Patent No.: US 10,255,398 B2
(45) Date of Patent: Apr. 9, 2019

(54) AUTOMATED TECHNIQUES FOR DESIGNING PROGRAMMED ELECTRONIC DEVICES

(71) Applicant: AUTODESK, INC., San Rafael (CA)

(72) Inventors: Tovi Grossman, Toronto (CA); George Fitzmaurice, Toronto (CA); Fraser Anderson, Camrose (CA)

(73) Assignee: AUTODESK, INC., San Rafael, CA (US)

( * ) Notice: Subject to any disclaimer, the term of this patent is extended or adjusted under 35 U.S.C. 154(b) by 22 days.

(21) Appl. No.: 15/291,032

(22) Filed: Oct. 11, 2016

(65) Prior Publication Data

US 2017/0147718 A1    May 25, 2017

Related U.S. Application Data

(60) Provisional application No. 62/258,391, filed on Nov. 20, 2015.

(51) Int. Cl.
*G06F 17/50*    (2006.01)

(52) U.S. Cl.
CPC .................. *G06F 17/505* (2013.01)

(58) Field of Classification Search
CPC .............. G06F 17/505; G06F 17/5045; G06F 17/5054; G06F 21/76
USPC ......................... 716/104, 116–117
See application file for complete search history.

(56) References Cited

U.S. PATENT DOCUMENTS

2005/0289485 A1* 12/2005 Willis ............ G01B 31/318364
716/104

2011/0276931 A1* 11/2011 Baumgartner ........ G06F 17/505
716/106

OTHER PUBLICATIONS

Dey, A.K., Abowd, G.D., and Salber, D. A Conceptual Framework and a Toolkit for Supporting the Rapid Prototyping of Context-aware Applications. Human-Computer Interaction 16, 2 (2001), 97-166.

Dey, A.K., Hamid, R., Beckmann, C., Li, I., and Hsu, D. A CAPpella: Programming by Demonstration of Context-aware Applications. CHI (2004), 33-40.

(Continued)

*Primary Examiner* — Paul Dinh
(74) *Attorney, Agent, or Firm* — Artegis Law Group, LLP

(57) ABSTRACT

In one embodiment, a device generator automatically generates a circuit, firmware, and assembly instructions for a programmed electronic device based on behaviors that are specified via mappings between triggers and actions. In operation, the device generator generates a circuit based on the mappings. The circuit specifies instances of electronic components and interconnections between the instances. Subsequently, the device generator generates firmware based on code fragments associated with the triggers and actions included in the mappings that specify the high-level behavior. In addition the device generator generates assembly instructions based on the interconnections between the instances. Advantageously, the device generator provides an automated, intuitive design process for programmed electronic devices that does not rely on the designers possessing any significant technical expertise. By contrast, conventional design processes for programmed electronic devices typically only automate certain steps of the design process, require specialized knowledge, and/or are limited in applicability.

20 Claims, 5 Drawing Sheets

(56) References Cited

OTHER PUBLICATIONS

Dey, A.K., Sohn, T., Streng, S., and Kodama, J. iCAP: Interactive Prototyping of Context-Aware Applications. Pervasive Computing (2006), 254-271.
Hartmann, B., Abdulla, L., Mittal, M., and Klemmer, S.R. Authoring Sensor-based Interactions by Demonstration with Direct Manipulation and Pattern Recognition. CHI (2007), 145-154.
Hartmann, B., Klemmer, S.R., Bernstein, M., Abdulla, L., Burr, B., Robinson-Mosher, A., and Gee, J. Reflective Physical Prototyping Through Integrated Design, Test, and Analysis. UIST (2006), 299-308.
Hodges, S., Villar, N., Chen, N., Chugh, T., Jie, Q. Nowacka, D., and Kawahara, Y. Circuit Stickers: Peel-and-stick Construction of Interactive Electronic Prototypes. CHI (2014), 1743-1746.
Humble, J., Crabtree, A., Hemmings, T., Akesson, K. "Playing with the Bits" User-Configuration of Ubiquitous Domestic Environments. UbiComp (2003), 256-263.
Kawahara, Y., Hodges, S., Cook, B.S., Zhang, C., and Abowd, G.D. Instant Inkjet Circuits: Lab-based Inkjet Printing to Support Rapid Prototyping of UbiComp Devices. UbiComp (2013), 363-372.
Mueller, S., Kruck, B., and Baudisch, P. LaserOrigami: Laser-cutting 3D Objects. CHI (2013), 2585-2592.
Mueller, S., Mohr, T., Guenther, K., Frohnhofen, J., and Baudisch, P. faBrickation: Fast 3D Printing of Functional Objects by Integrating Construction Kit Building Blocks. CHI (2014), 3827-3834.
Salber, D., Dey, A.K., and Abowd, G.D. The Context Toolkit: Aiding the Development of Context-enabled Applications. CHI (1999), 434-441.
Savage, V., Chang, C., and Hartmann, B. Sauron: Embedded Single-camera Sensing of Printed Physical User Interfaces. UIST (2013), 447-456.
Savage, V., Schmidt, R., Grossman, T., Fitzmaurice, G., and Hartmann, B. A Series of Tubes: Adding Interactivity to 3D Prints Using Internal Pipes. UIST (2014), 3-12.
Savage, V., Zhang, X., and Hartmann, B. Midas: Fabricating Custom Capacitive Touch Sensors to Prototype Interactive Objects. UIST (2012), 579-588.
Ur, B., McManus, E., Pak Yong Ho, M., and Littman, M.L. Practical Trigger-action Programming in the Smart Home. CHI (2014), 803-812.

* cited by examiner

```
<electronicComponent>
   <type>button</type>
    <name>button-9190</name>
    <description>Momentary switch</description>
    <partNumber>COM-09190</partNumber>
    <url>https://www.foo.com/products/9190</url>
    <geometry>button.stl</geometry>
    <canBeShared>false</canBeShared>
    <terminal>
        <name>Gnd</name>
        <description>Ground</description>
        <connection>male</connection>
        <type>gnd</type>
        <direction>in</direction>
        <isRequired>true</isRequired>
    </terminal>
    <terminal>
        <name>line</name>
        <description>Sensing line</description>
        <connection>male</connection>
        <type>digital</type>
        <direction>out</direction>
        <isRequired>true</isRequired>
    </terminal>
</electronicComponent>
```

Button Component Specification 430

```
<behaviour type="trigger">
   <name>ButtonPressed</name>
   <requiredComponent>button</requiredComponent>
   <parameter src="system" type="digital_in">  $triggerFunctionButtonPin</parameter>
   <headerCodeTemplate></headerCodeTemplate>
   <setupCodeTemplate>
      void $triggerFunctionSetup() {
         pinMode($triggerFunctionButtonPin, INPUT);
         digitalWrite($triggerFunctionButtonPin, HIGH);
      }
   </setupCodeTemplate>
   <functionCodeTemplate>
      bool $triggerFunction() {
         return !digitalRead($triggerFunctionButtonPin);
      }
   </functionCodeTemplate>
</behaviour>
```

Button Pressed Trigger Specification 440

FIGURE 4

AUTOMATED TECHNIQUES FOR DESIGNING PROGRAMMED ELECTRONIC DEVICES

CROSS-REFERENCE TO RELATED APPLICATIONS

This application claims the priority benefit of the U.S. Provisional Patent Application Ser. No. 62/258,391 and filed on Nov. 20, 2015. The subject matter of this related application is hereby incorporated herein by reference.

BACKGROUND OF THE INVENTION

Field of the Invention

Embodiments of the present invention relate generally to computer processing and, more specifically, to automated techniques for designing programmed electronic devices.

Description of the Related Art

Decreases in prices and increases in the availability of electronics have led to a proliferation of electronic devices that are programmed to execute different customized behaviors. Programmed electronic devices are commonly used in home automation systems, industrial safety systems, and interactive toys, to name a few. For example, a security monitor can include a programmable electronic device that sends a short message service (SMS) message to a predetermined phone number whenever a proximity sensor detects an approaching object. In another example, a teddy bear can include a programmable electronic device that rocks the teddy bear in response to any sound that exceeds a predetermined threshold.

Designing a programmed electronic device is typically a complex, multi-step process. First, the designer defines the high-level behavior for the programmed electronic device. Subsequently, the designer identifies and purchases multiple components (e.g., sensors, actuators, microcontrollers, etc.) and assembles the components into a circuit. The designer then writes firmware to control the operation of the circuit. Finally, the designer complies and uploads the firmware to the circuit. Accordingly, designing programmed electronic devices usually requires significant technical knowledge of components, circuitry, and programming. A lack of knowledge in one or more of these areas can discourage potential designers from attempting to design programmed electronic devices.

Certain conventional design tools exist that may be used during certain steps of the design process to reduce the breadth of technical knowledge required to successfully design programmed electronic devices. However, these design tools typically require specialized knowledge and/or have limited applicability. For example, some electronics prototyping kits enable users to construct functional circuits based on proprietary components. However, being able to efficiently develop functional circuits via a prototyping kit oftentimes requires in-depth knowledge of the prototyping kit and familiarity with the associated proprietary components. Further, the resulting functional circuits are limited to the topologies supported by the prototyping kit and the functionality provided by the proprietary components.

As the foregoing illustrates, what is needed in the art are more effective techniques for designing programmed electronic devices.

SUMMARY OF THE INVENTION

One embodiment of the present invention sets forth a computer-implemented method for designing a programmed electronic device. The method includes generating a circuit that includes instances and one or more connections between the instances based on one or more mappings, wherein a first instance included in the instances is an instance of a first electronic component, a second instance included in the instances is an instance of a second electronic component, and each mapping specifies a trigger and an action; for each mapping, generating one or more first code fragments that are associated with the trigger and one or more second code fragments that are associated with the action; generating firmware based on the one or more first code fragments and the one or more second code fragments generated for each mapping; and generating assembly instructions for the circuit based on the one or more connections between the instances.

One advantage of the disclosed techniques is that designers with limited or no knowledge of components, circuitry, and/or programming may effectively design programmed electronic devices. More specifically, the disclosed techniques provide a comprehensive, automated design process for programmed electronic devices (including both circuits and firmware) via intuitive trigger-action mappings. By contrast, electronics prototyping kits that may be used during the circuit generation step of the design process oftentimes require in-depth knowledge of the prototyping kit and familiarity with the associated proprietary components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 illustrates examples of a button component specification included in the component library of FIG. 1 and a button pressed trigger specification included in the trigger library of FIG. 1, according to various embodiments of the present invention.

DETAILED DESCRIPTION

In the following description, numerous specific details are set forth to provide a more thorough understanding of the present invention. However, it will be apparent to one of skilled in the art that the present invention may be practiced without one or more of these specific details.

System Overview

Figure 1:
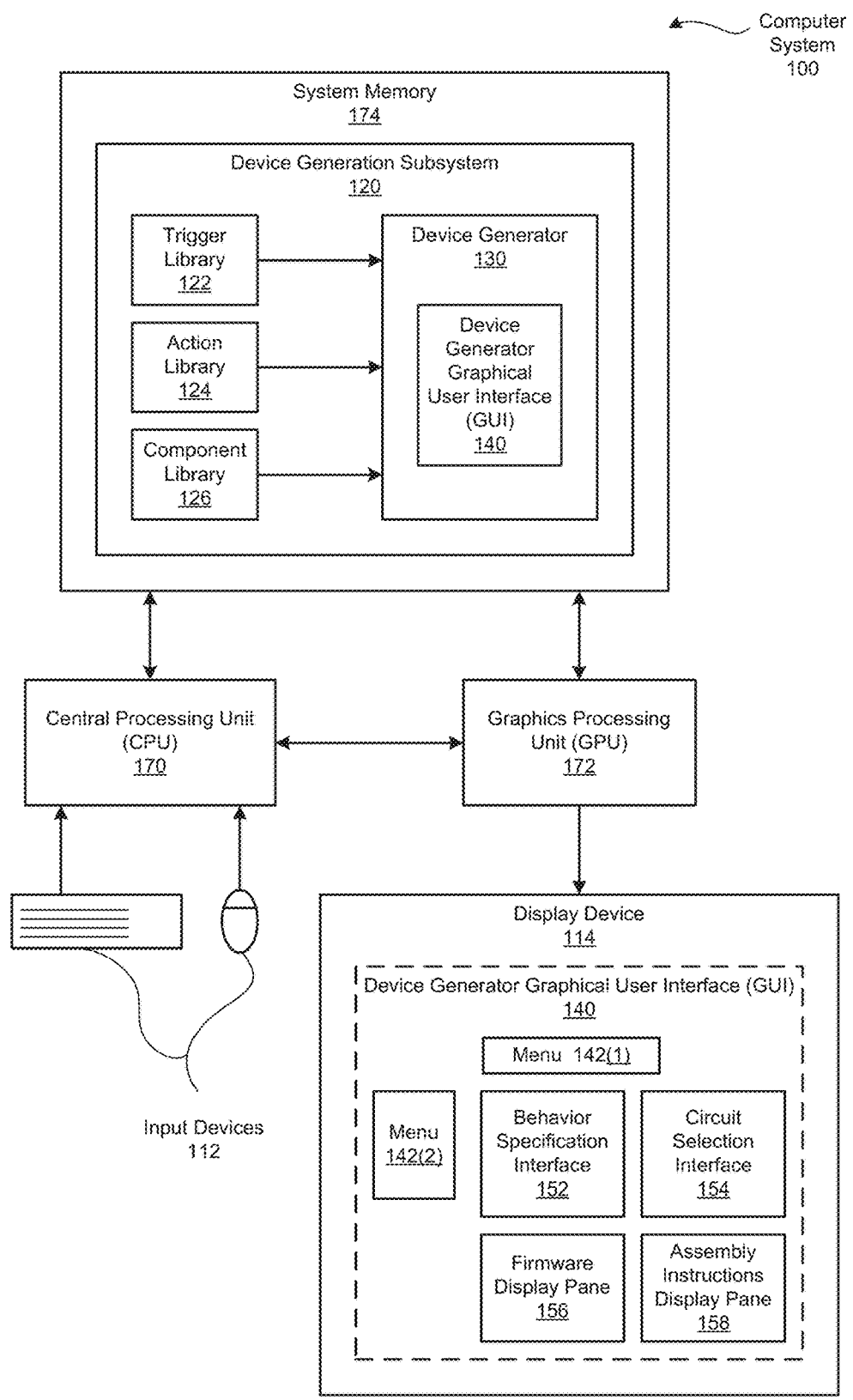
FIG. 1 is a conceptual illustration of a computer system configured to implement one or more aspects of the present invention.

FIG. 1 is a conceptual illustration of a computer system 100 configured to implement one or more aspects of the present invention. As shown, the computer system 100 includes, without limitation, a central processing unit (CPU) 170, input devices 112, a graphics processing unit (GPU) 172, a display device 114, and a system memory 174. For explanatory purposes, multiple instances of like objects are denoted with reference numbers identifying the object and parenthetical numbers identifying the instance where needed.

The CPU 170 receives input user input from the input devices 112, such as a keyboard or a mouse. In operation, the CPU 170 is the master processor of the computer system 100, controlling and coordinating operations of other system components. In particular, the CPU 170 issues commands that control the operation of the GPU 172. The GPU 172 incorporates circuitry optimized for graphics and video processing, including, for example, video output circuitry. The GPU 172 delivers pixels to the display device 114 that may be any conventional cathode ray tube, liquid crystal display, light-emitting diode display, or the like.

In various embodiments, GPU 172 may be integrated with one or more of other elements of FIG. 1 to form a single system. For example, the GPU 172 may be integrated with the CPU 170 and other connection circuitry on a single chip to form a system on chip (SoC). In alternate embodiments, the CPU 170 and/or the GPU 172 may be replaced with any number of processors. Each of the processors may be any instruction execution system, apparatus, or device capable of executing instructions. For example, a processor could comprise a digital signal processor (DSP), a controller, a microcontroller, a state machine, or any combination thereof.

The system memory 174 stores content, such as software applications and data, for use by the CPU 170 and the GPU 172. The system memory 174 may be any type of memory capable of storing data and software applications, such as a random access memory (RAM), a read-only memory (ROM), an erasable programmable read-only memory (EPROM or Flash ROM), or any suitable combination of the foregoing. In some embodiments, a storage (not shown) may supplement or replace the memory 174. The storage may include any number and type of external memories that are accessible to the CPU 170 and/or the GPU 172. For example, and without limitation, the storage may include a Secure Digital Card, an external Flash memory, a portable compact disc read-only memory (CD-ROM), an optical storage device, a magnetic storage device, or any suitable combination of the foregoing.

It will be appreciated that the computer system 100 shown herein is illustrative and that variations and modifications are possible. The number of CPUs 170, the number of GPUs 172, the number of system memories 174, and the number of applications included in the system memory 174 may be modified as desired. Further, the connection topology between the various units in FIG. 1 may be modified as desired. In some embodiments, any combination of the CPU 170, the GPU 172, and the system memory 174 may be replaced with any type of distributed computer system or cloud computing environment, such as a public or a hybrid cloud.

As shown, the system memory 174 includes, without limitation, a device generation subsystem 120. The device generation subsystem 120 facilitates the design of programmed electronic devices. As referred to herein, a programmed electronic device includes, without limitation, instances of electronic components interconnected to form a circuit as well as associated firmware. More precisely, the electronic components may include both programmable and non-programmable electronic components, and the associated firmware is stored and subsequently executes within instances of the programmable electronic components.

Designing programmed electronic devices usually requires significant technical of components, circuitry, and programming. Certain conventional design tools exist that may be used during certain steps of the design process to reduce the breadth of technical knowledge required to successfully design programmed electronic devices. However, these design tools typically require specialized knowledge and/or have limited applicability. For example, some electronics prototyping kits enable users to construct functional circuits based on proprietary components. However, being able to efficiently develop functional circuits via a prototyping kit oftentimes requires in-depth knowledge of the prototyping kit and familiarity with the associated proprietary components. Further, the resulting functional circuits are limited to the topologies supported by the prototyping kit and the functionality provided by the proprietary components.

Automatically Designing Programmed Electronic Devices

To enable designers with relatively little or no relevant technical knowledge to effectively design programmed electronic devices, the device generation subsystem 120 includes, without limitation, a device generator 130, a component library 126, a trigger library 122, and an action library 124. In general, the device generator 130 automatically generates a circuit, firmware, and assembly instructions for a programmed electronic device that provides behaviors specified by the designer. In some embodiments, the device generator 130 also configures a compiler (not shown in FIG. 1) to compile and upload the firmware to one or more instances of programmable electronic components.

The component library 126 defines any number and type of electronic components. For example, the component library 126 could include sensors, actuator components, and microcontrollers. The sensors could include a temperature sensor, a light sensor, an accelerometer, an infrared distance sensor, and a power outlet current sensor. The actuator components could include a light emitting diode (LED), an audio buzzer, a power relay (to control 120 volt outlets), a direct current (DC) motor, a water pump, and a vibrotactile motor. The microcontrollers could include an "Arduino® UNO" and an "Arduino® UNO Wi-Fi."

Each electronic component included in the component library 126 is defined within the component library 126 by a declarative specification. As referred to herein, a declarative specification describes a structure and/or elements based on logical statements. For example, information included in a rule-based medical database may be defined by declarative specifications written in the Rule Interchange Format (RIF). In some embodiments, each electronic component is defined in an extensible markup language (XML) file. In alternate embodiments, the electronic components may be defined in any technically feasible fashion procedural statements, etc.) The specification of each electronic component describes, without limitation, component attributes associated with the electronic component and terminals of the electronic component.

The component attributes include, without limitation, a component type that describes a functional requirement that the electronic component fulfills. For example, the component type could be "button," "microcontroller," or "5 volt power." The component attributes may also include any number and type of additional information that is associated with the electronic component. For example, each of the component attributes could include a name, a description, a part number, a Uniform Resource Locator (URL), or a dependency upon another component type.

Each terminal specification describes a terminal. As referred to herein, a terminal is a potential electronic connection to another electronic component. Each terminal specification includes, without limitation, a name, a type of connection (e.g., "male," "female," "soldered," etc.), a type of terminal (e.g., digital), and a direction of current flow (e.g., "in"). Each terminal specification may include any number and type of additional information that is associated with the terminal.

The trigger library 122 defines any number of triggers. Each trigger specifies an event that can be detected or scheduled. Examples of triggers include, "when a temperature exceeds a threshold," "when a tweet with a certain phrase occurs," "when an associated object is moved," and "when another object broadcasts a message," to name a few. The action library 124 defines any number of actions. Each action specifies a process or command(s) to be executed. Some examples of actions include "pump water," "toggle power outlet," "tweet message," glow, buzz, and "broadcast messages to other objects."

Each trigger is defined within the trigger library 122 by a declarative specification. Similarly, each action is defined within the action library 124 by a declarative specification. For example, in some embodiments, the triggers are defined in one XML file and the actions are defined in another XML file. In alternate embodiments, the triggers and actions may be defined in any technically feasible fashion procedural statements, etc.). Further the triggers and actions may be specified in any number of files (including one).

The specification of each trigger and action defines behavior attributes that describe the trigger/action, parameters that customize the trigger/action, and one or more code fragments that define the functionality of the trigger/action. In particular, the behavior attributes include the component type(s) that the trigger/action is dependent upon. The definition of component types with respect to the trigger library 122 and the action library 124 matches the definition of component types with respect to the component library 126. For example, the specification of the action "glow" included in the action library 124 may define a dependency on a component type "microcontroller," and the specification of the component "Arduino® UNO" included the component library 126 may define the component type as "microcontroller."

Each parameter included in a trigger/action defines, without limitation, any number of a parameter name, a parameter source, and a parameter type. The parameter name identifies the parameter as a customizable item. The parameter source specifies whether the parameter is defined by the device generator 130 or designer input data. The parameter type defines any required programmable component resource (e.g., analog input, pulse width modulated (PWM) output, etc.). In alternate embodiments, the specification of a trigger/action may include any number and type of behavior attributes and any number of parameters that are consistent with the component library 122 and the functionality of the device generator 130.

The code fragment(s) describe the functionality of the trigger/action. As described in detail below in conjunction with FIG. 2, as part of implementing a programmed electronic device based on a given trigger/action, the device generator 130 integrates code fragment(s) into firmware. Notably, the code fragments may include one or more of the parameters. As part of generating the firmware, the device generator 130 replaces the parameters with customized values determined based on the parameter source. Further, each code fragment may specify the role of the code fragment within the firmware. For instance, in some embodiments, an "initialization" code fragment may be executed during initialization. A "function" code fragment may be executed each time the state of the programmed electronic device changes. An "unscoped" code fragment may be included in the unscoped area of the firmware to define global variables and/or include additional program directives.

As shown, the device generator 130 includes, without limitation, a device generator graphical user interface (GUI) 140. In operation, the device generator 130 causes the display device 114 to display the device generator GUI 140. In general, the device generator GUI 140 provides a variety of visual components (e.g., user interface widgets, panels, tabs, etc) that enable the designer to guide the automated design of a programmed electronic device via the input devices 112. More specifically, as depicted with a dotted box, the device generator GUI 140 provides, without limitation, menus 142, a behavioral specification interface 152, a circuit selection interface 154, a firmware display pane 156, and an assembly instruction display pane 158. In some embodiments, the device generator 130 may tailor the visual components included in the device generator GUI 140 based on the current step in the design process. For example, during an initialization step, the device generator 130 could configure the device generator GUI 140 to include only a top-level menu 142.

During an initialization step, the device generator 130 receives and processes the component library 126, the trigger library 122, and the action library 124. The device generator 130 may receive and process the component library 126, the trigger library 122, and the action library 124 in any technically feasible fashion. For instance, in some embodiments, the device generator 130 may be configured to obtain the component library 126, the trigger library 122, and the action library 124 from a default memory location. In some other embodiments, the designer may specify the locations of the component library 126, the trigger library 122, and the action library 124 via the menu 142.

During a behavior specification step, the device generator 130 displays the behavior specification interface 152. The behavior specification interface 152 enables the designer to specified a desired behavior based on intuitive behavior mappings. As referred to herein, a behavior mapping is a mapping between a trigger that is included in the trigger library 122 and an action that is included in the action library 124. For example, a behavior mapping for a programmed electronic device that controls a fan could be a mapping between a trigger "a temperature exceeds a specified threshold" and an action "turn on a fan."

Upon receiving a new behavior mapping from the designer, the device generator 130 generates a potential circuit list based on all the specified behavior mappings and the component library 126. More precisely, the device generator 130 performs one or more dependency resolution operations to generate any number of potential circuits that enable the behaviors defined by the behavior mappings. Each potential circuit includes, without limitation, any number of instances of any number of components included in the component library 126, and connection data that specifies connections between terminals of the instances. Further, for each potential circuit, the device generator 130 computes any number of circuit properties that characterize the potential circuit. For example, the circuit properties could include cost, number of components, and size.

The device generator 130 configures the circuit selection interface 154 to display the potential circuit list and the associated circuit properties. As the designer specifies additional behavior mappings, the device generator 130 updates the potential circuit list and the circuit selection interface 154. After the designer selects one of the potential circuits as the device circuit, the device generator 130 automatically generates firmware based on the circuit, the behavior mappings, the trigger library 122, and the action library 124. The device generator 130 then generates assembly instructions in a user-friendly e.g., format text description) based on the device circuit and the component library 126.

Subsequently, the device generator 130 displays the firmware in the firmware display pane 156 and the assembly instructions in the assembly instructions display pane 158. In alternate embodiments, as part of generating each potential circuit, the device generator 130 may automatically generate and store the associated firmware and/or assembly instructions. In such embodiments, after the designer selects one of the potential circuits as the device circuit, the device generator 130 does not regenerate the associated firmware and/or assembly instructions. Instead, the device generator 130 displays the stored firmware associated with the device circuit via the firmware display pane 156 and/or the stored assembly instructions associated with the device circuit via the assembly instructions display pane 158.

Finally, in some embodiments, the device generator 130 may enable the designer to automatically compile and upload the firmware. More precisely, based on designer input data, the device generator 130 may configure a compiler (not shown in FIG. 1) to compile and upload firmware to instances of programmable electronic component(s) included in the device circuit.

Advantageously, because the component library 126, the trigger library 122, and the action library 124 are defined by declarative specifications written in XML, third-party authors may add, modify, and/or share the electronic components, triggers, and actions. Consequently, the device generator 130 may be configured to automate the design of programmed electronic devices that include a wide range of electronic components and provide complex behaviors.

Note that the techniques described herein are illustrative rather than restrictive, and may be altered without departing from the broader spirit and scope of the invention. Many modifications and variations on the functionality provided by the device generation subsystem 120, the device generator 130, and/or the device generator GUI 140 will be apparent to those of ordinary skill in the art without departing from the scope and spirit of the described embodiments. For example, in various embodiments, any number of the techniques may be implemented while other techniques may be omitted in any technically feasible fashion that generates a circuit, firmware, and assembly instructions based on mappings between triggers and actions.

The components illustrated in the computer system 100 may be included in any type of computer system 100, e.g., desktop computers, server computers, laptop computers, tablet computers, and the like. Additionally, the device generator 130 may execute on distributed systems communicating over computer networks including local area networks or large, wide area networks, such as the Internet. Notably, the device generator 130 described herein is not limited to any particular computing system and may be adapted to take advantage of new computing systems as they become available.

In alternate embodiments, the system memory 174 may not include the device generation subsystem 120, the device generator 130, the trigger library 122, the action library 124, and/or the component library 126. In some embodiments, any number of the trigger library 122, the action library 124, and/or the component library 126 may be stored on computer readable media such as a CD-ROM, DVD-ROM, flash memory module, or other tangible storage media. Further, in some embodiments, the device generator 130 may be provided as an application program (or programs) stored on computer readable media such as a CD-ROM, DVD-ROM, flash memory module, or other tangible storage media. In various embodiments, the functionality of the device generator 130 is integrated into or distributed across any number (including one) of software applications.

The trigger library 122, the action library 124, and the component library 126 may be implemented and provided to the device generator 130 in any technically feasible fashion. In alternate embodiments, the device generation subsystem 120 may include any number and combination of the trigger libraries 122, the action libraries 124, and the component libraries 126. In such embodiments, the device generator 130 may be configured to process any number and combination of the trigger libraries 122, the action libraries 124, and the component libraries 126 in any technically feasible fashion.

The functionality of the device generator 130 may be implemented and provided in any technically feasible fashion. In alternate embodiments, the device generation subsystem 120 and/or the device generator 130 are provided as a cloud-based service. For instances, in some embodiments, the device generator 130 may interact with a designer via a web page in a web browser, and the device generator 130 may execute algorithms to generate the circuit, firmware, and assembly instructions on processor(s) included in a cloud.

Figure 2:
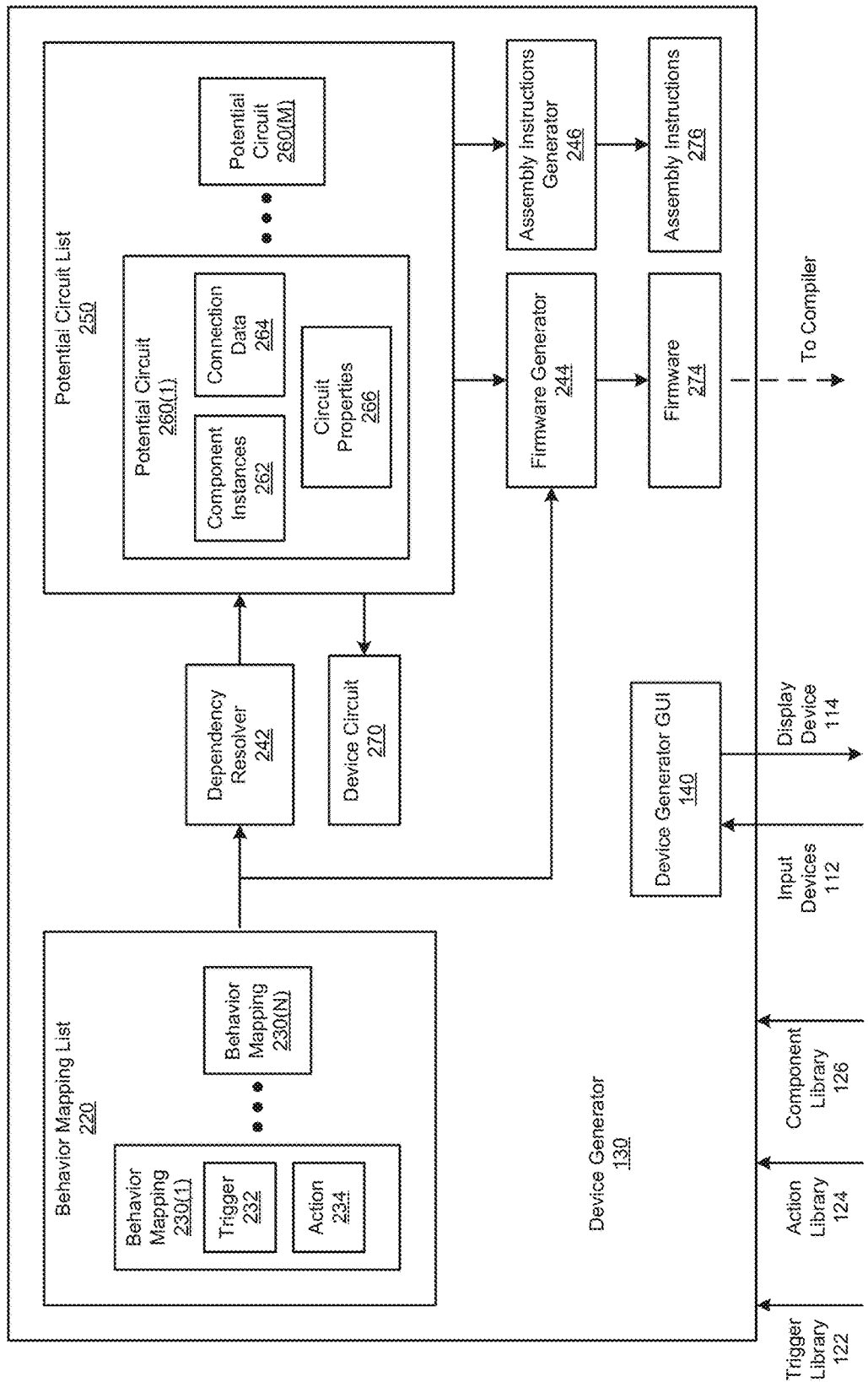
FIG. 2 is a more detailed illustration of the device generator of FIG. 1, according to various embodiments of the present invention.

FIG. 2 is a more detailed illustration of the device generator 130 of FIG. 1, according to various embodiments of the present invention. As shown, the device generator 130 includes, without limitation, the device generator GUI 140, a behavior mapping list 220, a dependency resolver 242, a potential circuit list 250, a device circuit 270, a firmware generator 244, firmware 274, an assembly instructions generator 246, and assembly instructions 276.

As shown, the behavior mapping list 220 includes, without limitation, any number of behavior mappings 230. Each of the behavior mappings 230 includes, without limitation, a trigger 232 and an action 234. In operation, the device generator 130 generates the behavior mapping list 220 based on designer input data that the device generator 130 receives via the behavioral specification interface 152. More precisely, the designer input data specifies a mapping between a selected trigger that is defined in the trigger library 122 and a selected action that is defined in the action library 124. In response to the designer input data, the device generator 130 adds a new behavior mapping 230 to the behavior mapping list 220, sets the trigger 232 equal to the selected trigger, and sets the action 234 equal to the selected action. In various embodiments, the device generator 130 may also set one or more values for the parameters included in the trigger 232 and/or the action 234 based on designer input data.

The flexibility inherent in specifying behaviors based on mappings between the triggers 232 and the actions 234 enables the designer to specify complex behaviors for the programmed electronic device in an intuitive manner. Notably, because each of the triggers 232 and each of the actions 234 may be included in multiple behavior mappings 230, the designer may define many-to-many mappings between any number of the triggers 232 and any number of the actions 234. More specifically, a given trigger 232 may be included in multiple behavior mappings 230 that each include a different action 234. Similarly, a given action 234 may be included in multiple behavior mappings 230 that each include a different trigger 232.

As the device generator 130 adds a new behavior mapping 230 to the behavior mapping list 220, the dependency resolver 242 (re)generates the potential circuit list 250. As shown, the potential circuit list 250 includes, without limitation, any number of potential circuits 260. Each of the potential circuits 260 includes, without limitation, any number of component instances 262, connection data 264, and circuit properties 266. Each of the component instances 262 is an instance of a component that is specified in the component library 126. The connection data 264 is a list of connections between the terminals of the component instances 262. The circuit properties 266 may include any informational circuit information (e.g., cost, size, number of components, etc.)

To generate the potential circuits 260, the dependency resolver 242 implements a breadth-first, recursive, dependency algorithm. In particular, the dependency resolver 242 explores combinations of potential component instances to determine the potential circuits 260 that satisfy the dependencies associated with the behavior mapping list 220 and the dependencies between components. As referred to herein, a potential component instance is an instance of a component that is specified in the component library 126 that the dependency resolver 242 is currently evaluating as part of the dependency algorithm.

The dependencies associated with the behavior mapping list 220 include the dependencies of each of the behavior mappings 230. For each of the behavior mappings 230, the dependency resolver 242 determines the dependencies based on the specification of the trigger 232 in the trigger library 122 and the specification of the action 234 in the action library 124. For example, each of the triggers 232/actions 234 specify the component type(s) that the trigger 232/action 234 is dependent upon. Further, each of the triggers 232/actions 234 may specify additional dependencies, such as the type of a component resource that the trigger 232/action 234 is dependent upon (e.g., analog input, pulse width modulated (PWM) output, etc.). In a similar manner, the dependency resolver 242 determines any dependencies between the potential component instances based on the component library 126.

As the dependency resolver 242 selects a new potential component instance and resolves dependencies, the dependency resolver 242 updates terminal availability lists for all current potential component instances. For each current potential component instance, the terminal connection list specifies whether or not each of the terminals of the potential component instance is connected to another potential component instance. For example, suppose that the dependency resolver 242 selects a first potential component instance that includes the terminals "A0" and "A1," and connects a terminal of a second potential component instance to the "A0" terminal to resolve a dependency. Further, suppose that the dependency resolver 242 then selects a third potential component instance and attempts to connect a terminal of the third potential component instance to the "A0" terminal of the first potential component instance to resolve another dependency. In such a scenario, the dependency resolver 242 determines that the terminal "A0" is unavailable based on the terminal connection list. Consequently, the dependency resolver 242 connects the terminal of the third potential component instance to the "A1" terminal of the first potential component instance.

The dependency resolver 242 continues to resolve dependencies until the dependency resolver has determined that the selected potential component instances and terminal connection list satisfy all the dependencies. If the dependency resolver 242 has satisfied all the dependencies, then the dependency resolver 242 generates a new potential circuit 260 based on the potential component instances and terminal connection list. As part of generating the new potential circuit 260, the dependency resolver 242 determines the circuit properties 266 in any technically feasible fashion. The dependency resolver 242 continues to generate new potential circuits 260 until the dependency algorithm has explored combinations of potential component instances up to a predetermined depth (e.g., ten).

In alternate embodiments, the dependency resolver 242 may implement any number and type of techniques to identify the potential circuits 260 based on the behavior mapping list 220 and the specifications included in the trigger library 122, the action library 124, and the component library 126. In various embodiments, the dependency resolver 242 may implement any type of dependency resolving heuristics or techniques instead or in addition to a breadth-first, recursive dependency algorithm. For instance, in some embodiments, the dependency resolver 242 may include additional search and filtering criteria that limit the number of potential circuit 260.

After the dependency resolver 242 (re)generates the potential circuit list 250, the device generator 130 displays information associated with the potential circuits 260, including the associated circuit properties 266 via the circuit selection interface 154. As the designer specifies additional behavior mappings, the dependency resolver 242 updates the potential circuit list 250 and the device generator 130 updates the circuit selection interface 154. After the designer selects one of the potential circuits 260 via the circuit selection interface 154, the device generator 130 sets the device circuit 270 equal to the selected potential circuit 260. The device circuit 270 is the circuit of the programmed electronic device designed to implement the behaviors specified by the designer.

After the device generator 130 determines the device circuit 270, the firmware generator 244 generates the firmware 274 associated with the device circuit 270. The firmware 274 may include any number and type of code that programs any number and type of component instances 262 that are associated with programmable components (e.g., microcontrollers). The firmware generator 244 automatically generates the firmware 274 based on the device circuit 270, the behavior mapping list 220, the trigger library 122, and the action library 124.

Notably, the firmware generator 244 may generate the firmware 274 in any format that is compatible with the trigger library 122, the action library 124, and the component library 126. For instance, in some embodiments, the trigger library 122 and the action library 124 may include code fragments written in an Arduino® compatible subset of the C language, and the component library 126 includes the Arduino® UNO microcontroller. In such embodiments, the firmware generator 244 may generate the firmware 274 based on an Arduino® compatible subset of the C++ language.

For each of the triggers 232 and each of the actions 234 included in the behavior mapping list 220, the firmware generator 244 generates parametrized code fragments. As described previously herein, each of the triggers 232 is defined in the trigger library 122 and each of the actions 234 is defined in the action library 124. Further, the definition of each of the triggers 232/actions 234 includes parameterizable code fragments and a specification of each associated parameter that includes the parameter name and the parameter source. The parameter source specifies whether the parameter is defined by the device generator 130 or designer input data.

To parametrize the code fragments associated with the trigger 232/action 234 included in a given behavior mapping 230, the firmware generator 244 replaces the parameter names included in the code fragments with customized values based on the parameter source. For each parameter, the firmware generator 244 and/or the device generator 130 may determine the customized value in any technically feasible fashion that is consistent with the parameter source. For instance, in some embodiments, the device generator 130 may configure the device generator GUI 140 to obtain a customized value for a parameter from a designer when the designer selects the trigger 232/action 234. The device generator 130 may then store the customized value as part of the behavior mapping 230 or the trigger 232/action 234 included in the behavior mapping 230. In some embodiments, if the parameter source is the device generator 130, then the device generator 130 may determine the value for a parameter based on the component instances 262 and/or the connection data 264 associated with the device circuit 270.

In addition to replacing parameters in the code fragments, the firmware generator 244 also ensures that each code fragment is differentiated from other code fragments. In particular, the firmware generator 244 appends unique identifiers to function names and variables within each of the triggers 232 and actions 234 to support many-to-many mappings. The firmware generator 244 performs this differentiation process across the triggers 232 and the actions 234 included in the behavior mappings 230.

Subsequently, the firmware generator 244 assembles the parametrized and differentiated code fragments into a file—firmware 274—based on the role of the code fragment. The firmware generator 244 may assemble the firmware 274 in any technically feasible fashion. For instance, in some embodiments a code fragment may be an initialization code fragment, a function code fragment, or an unscoped code fragment. In such embodiments, the firmware generator 244 may include code setup, loop, and header declarations as part of assembling the code fragments. In various embodiments, the firmware generator 244 may leverage a master template to assemble and/or format the firmware 274.

After the firmware generator 244 generates the firmware 274, the device generator 130 updates the firmware display pane 156 to display the firmware 274. Further, in some embodiments, the device generator 130 configures the firmware display pane 156 and/or the menus 142 to allow the designer to upload the firmware 274 to the associated programmable component instance 262. Upon receiving designer input data that requests that the firmware 274 be uploaded, the device generator 130 configures a compiler to compile and upload the firmware 274 to the associated programmable component instance(s) 262. The device generator 130 may configure any type of compiler and/or uploader in any technically feasible fashion. In some embodiments, after uploading the firmware 274, the device generator 130 updates the device generator GUI 140 to visually indicate that the device generator 130 has finished uploading the firmware 274.

In addition, after the device generator 130 determines the device circuit 270, the assembly instructions generator 246 generates the assembly instructions 276 associated with the device circuit 270 based on the device circuit 270 and the component library 126. More specifically, the device generator 130 analyzes the connection data 264 in conjunction with the connection type of the terminals (e.g., "male," "female," "soldered," etc.), of the component instances 262. For each terminal-to-terminal connection, the assembly instructions generator 246 generates an appropriate textual connection instruction based on a lookup table. For example, if two female terminals are connected, then the assembly instructions generator 246 could generate a text that instructs the designer to connect the two terminals via a male-to-male jumper wire. After the assembly instructions generator 246 finishes processing all the connection data 264, the device generator 130 displays the assemble instructions 276 via the assembly instructions display pane 158.

In alternate embodiments, the assembly instruction generator 246 may generate the assembly instructions 276 in any technically feasible fashion. The assembly instructions 276 may be provided in any format and using any number and types of communication methods (e.g., visual, verbal, etc.). Further, the assembly instruction generator 246 and/or the device generator 130 may display and/or provide the assembly instructions 276 in any manner as known the art.

In general, the device generator 130, the dependency resolver 242, the firmware generator 244, and the assembly instructions generator 246 may execute concurrently, sequentially, or any combination thereof. Further, in alternate embodiments, the functionality of the firmware generator 244 and the assembly instructions generator 246 may be included in the dependency resolver 242. In such embodiments, as part of generating each of the potential circuits 260, the dependency resolver 242 may automatically generate and store the firmware and/or assembly instructions associated with the potential circuit 260.

Figure 3:
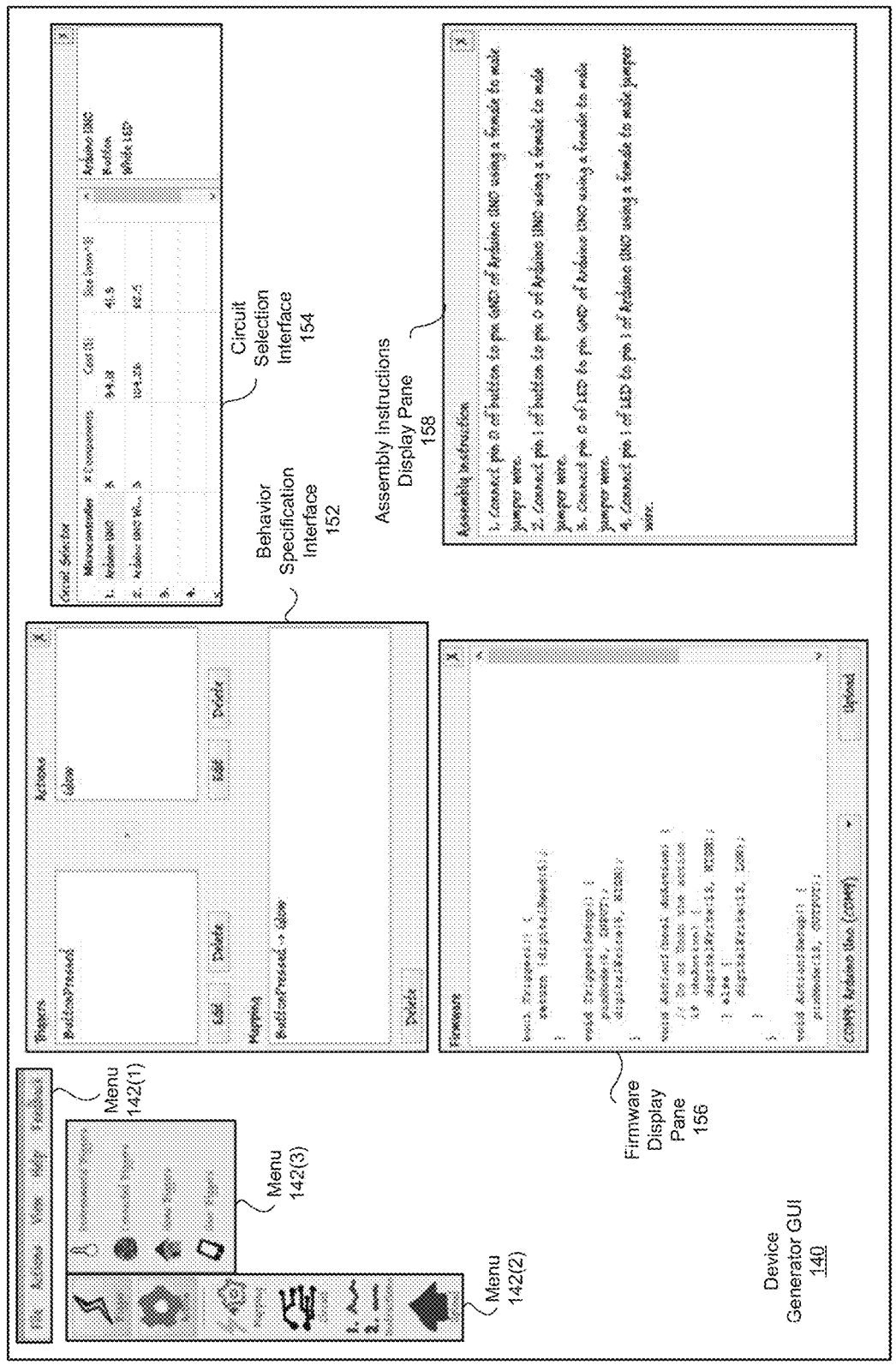
FIG. 3 illustrates an example of the device generator graphical user interface of FIG. 1, according to various embodiments of the present invention.

FIG. 3 illustrates an example of the device generator graphical user interface (GUI) 140 of FIG. 1, according to various embodiments of the present invention. More specifically, FIG. 3 depicts the appearance of the device generator GUI 140 on the display device 114 at a particular point in time. As shown, the device generator GUI 140 provides, without limitation, three menus 142, the behavior specification interface 152, the circuit selection interface 154, the firmware display pane 156, and the assembly instructions display pane 158.

In alternate embodiments, the device generator 130 may configure the device generator GUI 140 to provide any number of visual mechanisms for interacting with the device generator 130. The visual mechanisms may enable designers to specify the triggers 232, the actions 234, and the behavior mappings 230; select the device circuit 270; view/save the firmware 274; view/save the assembly instructions 276; and/or upload the firmware 274.

As shown, the menu 142(1) provides a variety of high level commands including "file," "help," and "feedback." The menu 142(2) provides commands associated with the behavior specification interface 152, the circuit selection interface 154, and the firmware display pane 156. The menu 142(3) is a sub-menu associated with the "trigger" button included in the menu 142(2). The menu 142(3) includes the categories "environmental triggers," "connected triggers," "home triggers," and "user triggers."

The menus 142(2) and 142(3) illustrate a wizard-style interface that enables the designers to specify the triggers 232 and actions 234 independently from one another. In general, after the designer selects the "trigger" or "action" button included in the menu 142(2), the device generator 130 provides a set of categories via the menu 142(3). After the designer selects a category, the device generator 130 may provide a set of sub-categories or triggers 232/actions 234 via another menu 142. In this fashion, the device generator 130 enables the designer to navigate a hierarchy of categories. Finally, after the designer selects a specific trigger 232 or action 234, the device generator 130 provides visual components that enable the designer to customize any parameters that are associated with the selected trigger 232/action 234. For example, if the designer selects the trigger 232 "trigger when hotter than," then the device generator 130 could configure the device generator GUI 140 to provide a slider to customize the associated temperature threshold parameter.

In some embodiments, the device generator 130 may configure the device generator GUI 140 to provide guidance to the user during the parameter specification process. For example, the device generator GUI 140 could provide a user-friendly description of a parameter along with examples of common uses. In another example, the device generator GUI 140 could provide one or more easily-understood reference points (e.g., average body temperate, boiling point of water, etc.) for the values of parameters.

As depicted in the behavior specification interface 152, the behavior mapping list 220 includes the behavior mapping 230 between the trigger 232 "button pressed" and the action 234 "glow." Accordingly, as depicted in the circuit selection interface 154, the dependency resolver 242 generates the two potential circuits 260 based on the behavior mapping list 220. The potential circuit 260(1) includes an "Arduino® UNO" microcontroller. By contrast, the potential circuit 260(2) includes an "Arduino® UNO Wi-Fi" microcontroller.

Because the potential circuit 260(1) that includes the Arduino® UNO" microcontroller is selected, the device generator 130 sets the device circuit 270 equal to the potential circuit 260(1). Further, the device generator 130 configures the circuit selection interface 154 to display the component instances 262 included in the device circuit 270. As depicted in the circuit selection interface 154, the component instances 262 included in the device circuit 270 are an "Arduino® UNO" microcontroller, a button, and a white LED.

Subsequently, the firmware generator 244 generates the firmware 274 associated with the device circuit 270. As depicted in the firmware display pane 156, the firmware 274 configures the instance of the "Arduino® UNO" microcontroller included in the device circuit 270 to provide the behavior "when button pressed, glow." In a complementary fashion, the instruction generator 246 generates the assembly instructions 276 associated with the device circuit 270. As depicted in the assembly instructions display pane 158, the assembly institutions 276 detail how to interconnect an "Arduino® UNO" microcontroller, a button, and a white LED via four female to male jumper cables to assembly the device circuit 270.

FIG. 4 illustrates examples of a button component specification 430 included in the component library 126 of FIG. 1 and a button pressed trigger specification 440 included in the trigger library 122 of FIG. 1, according to various embodiments of the present invention. As shown, the button component specification 430 and the button pressed trigger specification 440 are both written in XML. In alternate embodiments, the button component specification 430 and the button pressed trigger specification 440 may be specified in any technically feasible fashion. For example, in some embodiments, the button component specification 430 and the button pressed trigger specification 440 may include procedural statements.

The button component specification 430 describes an electronic component that is associated with a variety of component attributes and two terminals. The component attributes include a type "button," a name "button-9190," a description "momentary switch," and so forth. The two terminals are an input named "Gnd" that is described as a "ground," and an output named "line" that is described as a "sensing line."

The button pressed trigger specification 440 describes a trigger that is associated with a variety of behavior attributes, a customizable parameter, and two code fragments. The behavior attributes include a name "ButtonPressed" and a required component type "button." Accordingly, the trigger "ButtonPressed" is dependent on an electronic component that is of the type "button," such as the electronic component "button-9190" described in the button component specification 430. As shown, the button pressed trigger specification 440 includes the parameter "$triggerFunction-ButtonPin" and two code fragments that include the parameter "$triggerFunctionButtonPin." As described previously herein, the firmware generator 244 replaces the occurrences of the parameter "$triggerFunctionButtonPin" within the code fragments with customized values as part of generating the firmware 274.

Figure 5:
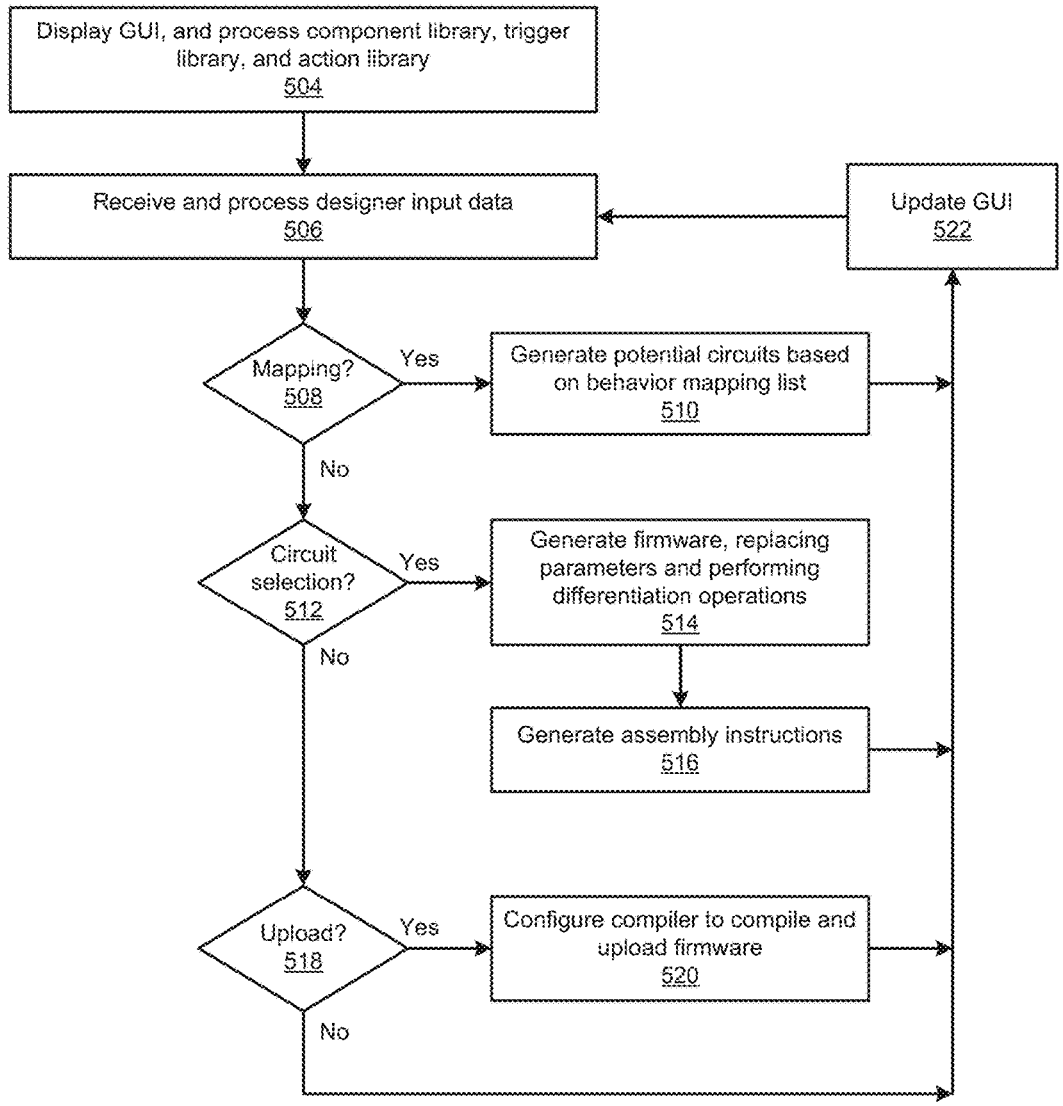
FIG. 5 is a flow diagram of method steps for automatically designing a programmed electronic device, according to various embodiments of the present invention.

FIG. 5 is a flow diagram of method steps for automatically designing a programmed electronic device, according to various embodiments of the present invention. Although the method steps are described with reference to the systems of FIGS. 1-4, persons skilled in the art will understand that any system configured to implement the method steps, in any order, falls within the scope of the present invention.

As shown, a method 500 begins at step 504, where the device generator 130 displays the device generator GUI 140 on the display device 114, and processes the component library 126, the trigger library 122, and the action library 124. Initially, the device generator 130 may configure the device generator GUI 140 to provide any number and combination of the interface components. For example, the device generator 130 could configure the device generation GUI 140 to provide the menu 142(1) and the behavioral specification interface 152. The device generator 130 may be configured to process the component library 126, the trigger library 122, and the action library 124 in any technically feasible fashion. For instance, in some embodiments, the device generator 130 may determine the locations of the component library 126, the trigger library 122, and the action library 124 based on user interface data received via the menu 142(1).

At step 506, the device generator 130 receives designer input data via the device generator GUI 140 and processes the designer input data. The device generator 130 may configure the device generator GUI 140 to receive any type of designer input data in any technically feasible fashion. Further, the device generator 130 may process any type of designer input data in any manner. For example, if the designer input data specifies the action 234, then the device generator 130 could configure the device generator GUI 140 to provide a menu 142 that enables the designer to enter values for parameters associated with the action 234.

At step 508, the device generator 130 determines whether the designer input data specifies a new behavior mapping 230 between the trigger 232 and the action 234. If, at step 508, the device generator 130 determines that the designer input data specifies a new behavior mapping 230, then the method 500 proceeds to step 510. At step 510, the dependency resolver 142 performs one or more dependency resolution operations to (re)generate the potential circuit list 250 based on the behavior mapping list 220 (including the new behavior mapping 230).

More precisely, the dependency resolver 242 explores combinations of potential component instances to determine the potential circuits 260 that satisfy the dependencies associated with the behavior mapping list 220 and the dependencies between components. The dependency resolver 242 may generate the potential circuits 260 in any technically feasible fashion. For instance, in some embodiments, the dependency resolver 242 may implement a breadth-first, recursive, dependency algorithm. The method 500 then proceeds directly to step 522, where the device generator 130 updates the device generator GUI 140 to reflect the (re)generated potential circuit list 250. The method 500 then returns to step 506, where the device generator 130 receives new designer input data.

If, however, at step 508, the device generator 130 determines that the designer input data does not specify a new behavior mapping 230, then the method 500 proceeds directly to step 512. At step 512, the device generator 130 determines whether the design input data selects one of the potential circuits 260 as the device circuit 270. If, at step 512, the device generator 130 determines that the designer input data selects one of the potential circuits 260 as the device circuit 270, then the method 500 proceeds to step 514. At step 514, the firmware generator 244 generates the firmware 274 based on the device circuit 270, the behavior mapping list 220, the trigger library 122, and the action library 124. In particular, the firmware generator 244 parametrizes and differentiates code fragments associated with the triggers 232 and the actions 234. The firmware generator 244 then assembles the parametrized, differentiated code fragments into the firmware 274.

At step 516, the assembly instructions generator 246 generates the assembly instructions 276 based on the device circuit 270 and the component library 126. For each terminal-to-terminal connection specified in the connection data 264 associated with the device circuit 270, the assembly instructions generator 246 generates an appropriate textual connection instruction based on a lookup table. In alternate embodiments, the assembly instruction generator 246 may generate the assembly instructions 276 in any technically feasible fashion. The method 500 then proceeds directly to step 522. At step 522, the device generator 130 updates the device generator GUI 140 to display the firmware 274 via the firmware display pane 156 and the assembly instructions 276 via the assembly instructions display pane 158. The method 500 then returns to step 506, where the device generator 130 receives new designer input data.

If, however, at step 512, the device generator 130 determines that the designer input data does not select one of the potential circuits 260 as the device circuit 270, then the method 500 proceeds directly to step 518. At step 518, the device generator 130 determines whether the designer input data requests that the device generator 130 upload the firmware 274. If, at step 518, the device generator 130 determines that the designer input data requests that the device generator 130 upload the firmware 274, then the method 500 proceeds to step 520.

At step 520, the device generator 130 configures a compiler to compile and upload the firmware 274 to the associated programmable component instance(s) 262 included in the device circuit 270. The device generator 130 may configure any type of compiler and/or uploader in any technically feasible fashion. The method 500 then proceeds directly to step 522. At step 522, the device generator 130 configures the device generator GUI 140 to indicate that the device generator 130 has finished uploading the firmware 274. The method 500 then returns to step 506, where the device generator 130 receives new designer input data.

If, however, at step 518, the device generator 130 determines that the designer input data does not request that the device generator 130 upload the firmware 274, then the method 500 proceeds directly to step 522. At step 522, the device generator 130 may update the device generator GUI 140 based on the designer input data in any technically feasible fashion. For example, if the designer input data selects a sub-menu, then the device generator 130 could configure the device generator GUI 140 to provide a new menu 142 that includes sub-sub-menu items. The method 500 then returns to step 506, where the device generator 130 receives new designer input data. The device generator 130 continues to cycle through steps 506-522, receiving and processing new designer input data, until the device generator 130 does not receive any new designer input data.

In sum, the disclosed techniques may be used to automatically design programmed electronic devices. A device generation subsystem includes a device generator, a trigger library, an action library, and a component library. The trigger library, the action library, and the component library provide declarative specifications of, respectively, triggers, actions, and components. In operation, the device generator displays a GUI that enables the designer to specify high-level behavior based on mappings between triggers and actions. Upon receiving each mapping, the device generator performs dependency resolution operations to generate potential circuits that include instances of components and connection data that satisfy the dependencies associated with all the mappings. The device generator then displays the potential circuits and a variety of informational circuit properties (e.g., cost, size, number of components, etc.)

After the designer selects one of the potential circuits, the device generator generates (and subsequently displays) firmware based on the triggers and actions included in the mappings, and textual assembly instructions based on the connection data. More specifically, as part of generating the firmware, the device generator replaces parameters in code fragments associated with the triggers and actions to generate parametrized code fragments. Subsequently, the device generator performs differentiation operations on the parametrized code fragments. The device generator then assembles the parametrized and differentiated code fragments to generate the firmware. Finally, upon receiving a request to upload the firmware, the device generator configures a compiler to compile and upload the firmware to instance(s) of programmable component(s) included in the circuit.

Advantageously, the device generation subsystem enables designers with limited or no knowledge of components, circuitry, and/or programming to effectively design programmed electronic devices. In particular, the device generation subsystem provides a comprehensive, automated design process for programmed electronic devices (including both circuits and firmware) via intuitive trigger-action mappings. By contrast, electronics prototyping kits that may be used during the circuit generation step of the design process oftentimes require in-depth knowledge of the prototyping kit and familiarity with the associated proprietary components. Further, because the component library encapsulates the functionality of electronic components in a declarative form, a wide-range of both proprietary and non-proprietary components may be included in and/or added to the component library.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a ""module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for designing a programmed electronic device, the method comprising:
   generating a circuit that includes a plurality of instances and one or more connections between the plurality of instances based on one or more mappings, wherein a first instance included in the plurality of instances is an instance of a first electronic component, a second instance included in the plurality of instances is an instance of a second electronic component, and each mapping specifies a trigger and an action;
   for each mapping, generating one or more first code fragments that are associated with the trigger and one or more second code fragments that are associated with the action;
   generating firmware based on the one or more first code fragments and the one or more second code fragments generated for each mapping; and
   generating assembly instructions for the circuit based on the one or more connections between the plurality of instances;
   wherein the circuit is subsequently included in the programmed electronic device to cause the programmed electronic device to execute, for each mapping, the action in response to the trigger specified by the mapping.

2. The computer-implemented method of claim 1, wherein, for a first mapping included in the one or more mappings, the trigger is associated with a first declarative specification, and the action is associated with a second declarative specification.

3. The computer-implemented method of claim 2, wherein the first declarative specification is included in an extensible markup language file.

4. The computer-implemented method of claim 1, wherein generating the circuit comprises performing one or more dependency resolution operations based on one or more dependencies associated with the one or more mappings.

5. The computer-implemented method of claim 1, wherein, for each mapping, generating the one or more first code fragments that are associated with the trigger comprises:
   determining a value for a parameter that is associated with the trigger based on at least one of input data and the circuit;
   identifying a parameterizable code fragment that is associated with the trigger; and replacing a name for the parameter that is included in the parameterizable code fragment with the value.

6. The computer-implemented method of claim 1, wherein the first electronic component comprises a programmable electronic component, and further comprising causing a compiler to compile and upload the firmware to the first instance.

7. The computer-implemented method of claim 1, wherein generating the assembly instructions comprises:
   determining that the one or more connections between the plurality of instances include a first connection between a first terminal of the first instance and a second terminal of the second instance; and
   generating an instruction for connecting the first terminal and the second terminal based on a connection type of the first terminal and a connection type of the second terminal.

8. The computer-implemented method of claim 1, wherein generating the circuit comprises:
   generating one or more potential circuits based on the one or more mappings;
   displaying one or more circuit properties associated with the one or more potential circuits on a display device;
   receiving a user selection of a first potential circuit included in the one or more potential circuits; and
   setting the circuit equal to the first potential circuit.

9. The computer-implemented method of claim 1, wherein the first electronic component comprises a sensor, an actuator, or a microcontroller.

10. One or more computer-readable storage media including instructions that, when executed by one or more processing units, cause the one or more processing units to design a programmed electronic device by performing the steps of:
    generating a circuit that includes a plurality of instances and one or more connections between the plurality of instances based on one or more mappings, wherein a first instance included in the plurality of instances is an instance of a first electronic component, a second instance included in the plurality of instances is an instance of a second electronic component, and each mapping specifies a trigger and an action;
    for each mapping, generating one or more first code fragments that are associated with the trigger and one or more second code fragments that are associated with the action;
    generating firmware based on the one or more first code fragments and the one or more second code fragments generated for each mapping; and
    generating assembly instructions for the circuit based on the one or more connections between the plurality of instances;
    wherein the circuit is subsequently included in the programmed electronic device to cause the programmed electronic device to execute, for each mapping, the action in response to the trigger specified by the mapping.

11. The one or more computer-readable storage media of claim 10, wherein the first electronic component is associated with a first declarative specification and the second electronic component is associated with a second declarative specification.

12. The one or more computer-readable storage media of claim 10, wherein generating the circuit comprises performing one or more dependency resolution operations based on one or more dependencies associated with the one or more mappings.

13. The one or more computer-readable storage media of claim 10, wherein, for each mapping, generating the one or more second code fragments that are associated with the action comprises:
    determining a value for a parameter that is associated with the action based on at least one of input data and the circuit;
    identifying a parameterizable code fragment that is associated with the action; and
    replacing a name for the parameter that is included in the parameterizable code fragment with the value.

14. The one or more computer-readable storage media of claim 10, wherein the first electronic component comprises a programmable electronic component, and further comprising causing a compiler to compile and upload the firmware to the first instance.

15. The one or more computer-readable storage media of claim 10, wherein generating the assembly instructions comprises:
    determining that the one or more connections between the plurality of instances include a first connection between a first terminal of the first instance and a second terminal of the second instance; and
    generating an instruction for connecting the first terminal and the second terminal based on a connection type of the first terminal and a connection type of the second terminal.

16. The one or more computer-readable storage media of claim 10, wherein generating the circuit comprises:
    generating one or more potential circuits based on the one or more mappings;
    displaying one or more circuit properties associated with the one or more potential circuits on a display device;
    receiving a user selection of a first potential circuit included in the one or more potential circuits; and
    setting the circuit equal to the first potential circuit.

17. The one or more computer-readable storage media of claim 16, wherein a first circuit property included in the one or more circuit properties specifies at least one of a size, a number of instances, and a cost.

18. The one or more computer-readable storage media of claim 10, wherein a first mapping included in the one or more mappings specifies a first trigger and a first action, and a second mapping included in the one or more mappings specifies the first trigger and a second action.

19. A system comprising:
    a memory storing a device generator; and
    a processor that is coupled to the memory and, when executing the device generator, is configured to:
      generate a circuit that includes a plurality of instances and one or more connections between the plurality of instances based on one or more mappings, wherein a first instance included in the plurality of instances is an instance of a first electronic component, a second instance included in the plurality of instances is an instance of a second electronic component, and each mapping specifies a trigger and an action;
      for each mapping, generate one or more first code fragments that are associated with the trigger and one or more second code fragments that are associated with the action;
      generate firmware based on the one or more first code fragments and the one or more second code fragments generated for each mapping; and
      generate assembly instructions for the circuit based on the one or more connections between the plurality of instances;

wherein the circuit is subsequently included in the programmed electronic device to cause the programmed electronic device to execute, for each mapping, the action in response to the trigger specified by the mapping.

20. The system of claim 19, wherein the first electronic component comprises a programmable electronic component, and the device generator further configures the processor to cause a compiler to compile and upload the firmware to the first instance.

* * * * *

UNITED STATES PATENT AND TRADEMARK OFFICE
CERTIFICATE OF CORRECTION

PATENT NO. : 10,255,398 B2
APPLICATION NO. : 15/291032
DATED : April 9, 2019
INVENTOR(S) : Tovi Grossman, George Fitzmaurice and Fraser Anderson Page 1 of 1

It is certified that error appears in the above-identified patent and that said Letters Patent is hereby corrected as shown below:

On the Title Page

(71) Applicant:
Please delete "AUTODESK, INC., San Rafael (CA)" and insert --AUTODESK, INC., San Rafael, CA (US)--.

Signed and Sealed this
Ninth Day of July, 2019

Andrei Iancu
*Director of the United States Patent and Trademark Office*